United States Patent [19]
Winston, IV

[11] 4,050,024
[45] Sept. 20, 1977

[54] SIDEBAND DETECTOR

[75] Inventor: Fendall Gregory Winston, IV, Portland, Oreg.

[73] Assignee: Tektronix, Inc., Beaverton, Oreg.

[21] Appl. No.: 618,872

[22] Filed: Oct. 2, 1975

[51] Int. Cl.² .................................................. H03B 3/04
[52] U.S. Cl. ................................. 328/134; 307/233 R; 307/271; 328/158; 331/1 A; 331/25
[58] Field of Search ............... 328/133, 134, 140, 158, 328/159; 307/233 R, 271, 295; 329/110, 112, 104; 331/12, 18, 25, 11, 10, 1 A; 332/19

[56] References Cited
U.S. PATENT DOCUMENTS

| 2,561,182 | 7/1951 | Crane, Jr. | 328/133 |
| 2,935,609 | 5/1960 | Rabin et al. | 331/25 |
| 3,012,200 | 12/1961 | Hurvitz | 328/134 |
| 3,337,813 | 8/1967 | Graeve | 331/25 |
| 3,614,635 | 10/1971 | La Pine | 331/1 A |

Primary Examiner—John Zazworsky
Assistant Examiner—Marcus S. Rasco
Attorney, Agent, or Firm—Kenneth M. Durk

[57] ABSTRACT

A sideband detector capable of detecting one of two mixing products and disregarding the other is provided. The characteristic of the invention is provided by feeding a sequential logic mixer in each of two channels by the output of a reference source which feeds one channel in phase and delayed to the second. An input signal is also simultaneously applied to both of the mixers. The mixer outputs then feed a sequential logic circuit for detecting the desired sideband.

3 Claims, 3 Drawing Figures

SIDEBAND DETECTOR

BACKGROUND OF THE INVENTION

A spectrum analyzer is a device which displays a graph of relative power distribution as a function of frequency, typically on a cathode ray tube or chart recorder (see "Spectrum Analyzer Circuits," Measurement Concepts, © TEKTRONIX, INC., 1969). This encompasses many different devices such as, for example, a properly programmed computer, a bank of filters, a swept or tuned filter, a superheterodyne signal-translation system, etc. Unlike an oscilloscope which may be capable of displaying the waveform of a single transient, a spectrum analyzer usually requires a repetitive signal in order to provide a satisfactory display. This is so because at any one instant, the receiver portion can only be tuned to a single component of a frequency spectrum. If a frequency present in a single transient is not in coincidence with the frequency to which the spectrum analyzer is tuned at the time of occurrence, it will not be displayed (see "Spectrum Analyzer Measurements," Measurement Concepts, © TEKTRONIX, INC., 1969). To determine this frequency or to determine what frequency components may be generated along with the desired signal, several techniques have been devised such as down-counting the desired frequency by means of a single or doubled balanced mixers. This can be accomplished by heterodyning the signal to the measured with a second known stable signal, such as a crystal-controlled signal, to obtain the sum and difference of these two signals. The low frequency component, usually the stable signal, is removed from the output of the mixer by means of filters leaving only the sum and difference frequencies and their combinations. These signals are then mixed again with the original signal to be measured for recovery of the desired frequency.

The above briefly described process does have disadvantages, however. For example, the frequencies applied to the mixers must be attenuated in order to prevent complex spurious signals from being generated when they are applied to the second mixer and mixed with the original input signal. Additionally, precision filters must be used to remove the frequency components; the reason for filtering being noise consideration as is well known.

SUMMARY OF INVENTION

The subject invention is an improvement over prior art means for detecting of sidebands in that mixing is accomplished using conventional combination and sequential logic and detection is accomplished using conventional sequential logic. Thus, there is no need for employment of precision phase networks, filters, attenuators, etc.

Basically, the characteristics of the invention are provided by feeding a mixer in each of two channels by the output of a reference source which feeds one channel in phase and delayed to the second. An input signal is also simultaneously applied to both of the mixers. The mixer outputs are then detected to provide the desired sideband.

It is therefore an object of the present invention to provide an improved sideband detector.

It is another object of the present invention to provide an improved sideband detector for a spectrum analyzer or similar instrument.

It is yet another object of the present invention to provide an improved digital sideband detector.

It is still yet another object of the present invention to provide an improved sideband detector which is extremely simple and economical.

The foregoing and numerous other objects, advantages, and inherent functions of the present invention will become apparent as the same is more fully understood from the following description and drawings wherein like characters refer to like elements and which describes the preferred embodiment of the invention; it is to be understood, however, that these embodiments are not intended to be exhausting nor limiting of the invention but are given for purposes of illustration in order that others skilled in the art may fully understand the invention and principles thereof and the manner of applying it in practical use so that they may modify it in various forms, each as may best be suited to the conditions of the particular use.

DESCRIPTION OF INVENTION

Figure 1:
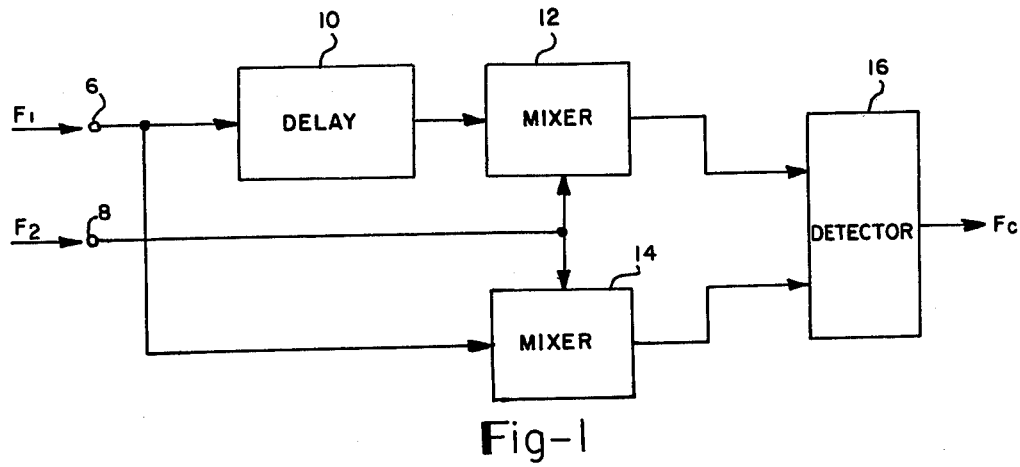
FIG. 1 is a block diagram of the sideband detector according to the present invention.

Referring now to the drawings and specifically to FIG. 1, there is shown in block diagram form the sideband detector according to the present invention.

A first signal $F_1$ is applied via a first input terminal 6 and is fed to a first mixer 12 via a delay means 10 and directly to a second mixer 14. The signal $F_1$ can be, for example, the output of a local oscillator in a spectrum analyzer, digital network analyzer or reference signal generating means such as a crystal controlled oscillator. (These sources of signal $F_1$ are not shown or described as they are well known.) Simultaneously feeding both first and second mixers 12 and 14 respectively, is a second signal $F_2$ applied via a second or common input terminal 8. The signal $F_2$ can be, for example, the output of a voltage controlled oscillator in a spectrum analyzer, digital network analyzer or controlled signal generating means such as a variable crystal controlled oscillator. (These sources of signal $F_2$ are not shown or described as they are well known.) A detection means 16 is fed by the outputs of the first and second mixers for selectively providing an output signal $F_c$ which is the desired sideband.

Figure 2:
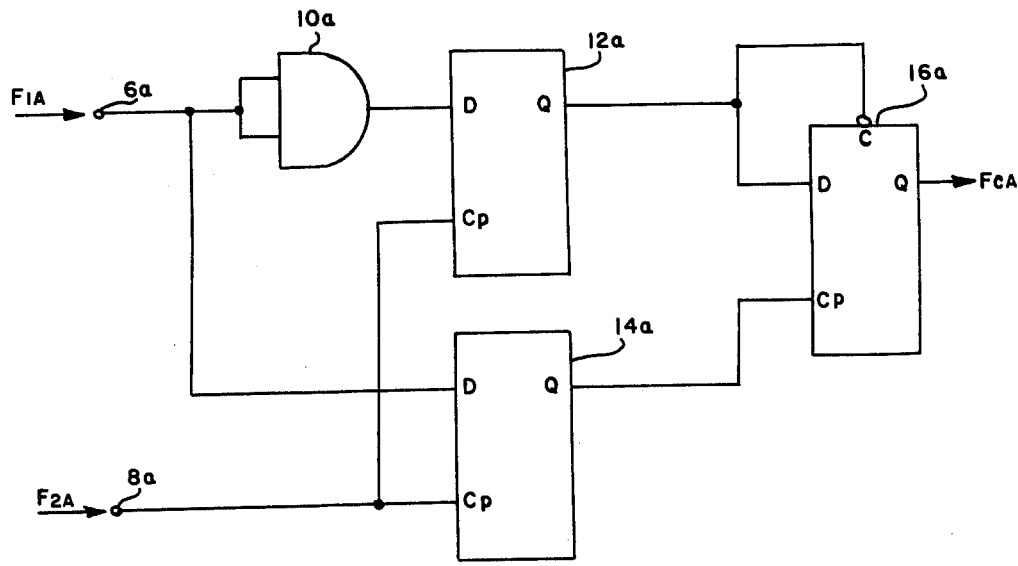
FIG. 2 is a schematic diagram of the sideband detector in accordance with FIG. 1.

Referring now to FIG. 2 there is illustrated a schematic diagram of the preferred embodiment of the invention wherein identical components to those in FIG. 1 have been given the same reference numbers used in FIG. 1. Thus, as illustrated the sideband detector contains a delay means 10a, two mixers 12a and 14a, and detection means 16a. Delay means 10a can be one of several types of conventional combinational logic means such as, for example, a two input AND gate whose inputs are connected together and connected to receive the signal $F_{1a}$ via the first input terminal 6a and having its output connected to feed first mixer 12a. The signal $F_{1a}$ also feeds the second mixer 14a. As can be discerned from FIG. 2, mixers 12a and 14a are sequential logic means such as, for example, conventional D flip-flops whose D inputs are connected to receive signals $F_{1a}$ delayed and direct, respectively. (Signal $F_{1a}$ is delayed.) The clock pulse inputs (Cp) of both mixers are simultaneously fed by second signal $F_{2a}$ applied via second input terminal 8a. The outputs of each mixer is the true, or Q, or 1 output, but under certain conditions could be the low, Q not, or 0.

The clear input (C) of another sequential logic means defining a D flip-flop is directly connected to its D input, and also to the output of mixer 12a whereas the clock pulse input (Cp) is directly connected to the output of second mixer 14a. This D flip-flop therefore defines the detection means. The output signal (detected sideband) Fca is taken at the Q output thereof. As can be discerned, the preferred embodiment of the present invention uses conventional D flip-flops. Alternatively, J-K flip-flops, R-S flip-flops or other well-known sequential logic means may be used. As the operation of such devices are well-known, no detailed discussion will be presented, but it is mentioned that such devices for sequential and combinational logic devices are fully described in "Computer Logic Design," by M. Morris Mano, Prentice-Hall, Inc., 1972.

To those skilled or having ordinary skill in the art, the sideband detector of the subject invention is an improvement over the prior art where frequency detectors have employed a mixer in each of two channels fed by a local oscillator which feeds one channel directly and the other channel through a precision phase shifting device and where the output of one or both of the mixers is differentiated and compared with the other in a multiplier or phase detector.

To fully understand and appreciate the invention, the following explanation is presented. $F_1$, the output from a reference source, is applied to the first input terminal 6 and is fed to the delay means 10 which provides a delayed signal $F_1 + \Delta\phi$, where $\Delta\phi$ is less than $1/f$; 20 nanoseconds typically.

Simultaneously feeding both the first and second mixers 12 and 14 respectively, is the signal $F_2$ from the variable source via the second input terminal 8. The signal $F_2$ could be equal to, slower than, or faster than the signal $F_1$. Accordingly, the mixing products, namely $F_2 \pm F_1$ and $F_2 \pm (F_1 + \Delta\phi)$ are provided at the mixer outputs. The mixing products are then applied to the detector means 16 where the detected sideband, $F_1 + F_2$ or $F_2 - F_1$ is provided.

The selection of which sideband is detected depends upon which input, $F_1$ or $F_2$, is i.e., the gate or delay means 10a can be utilized to delay the D input to the mixer 14a rather than the mixer 12a as shown or the gate can be utilized to delay either the clock input to the mixer 12a or to the mixer 14a. It should be also noted that a small time delay for one of the two input signals will result in a much larger time delay if the difference frequency is low. However, the absolute value of the time delay is unimportant allowing the detector output to be correct for a wide range of input time delays as long as T delay $< 1/f$.

Figure 3:
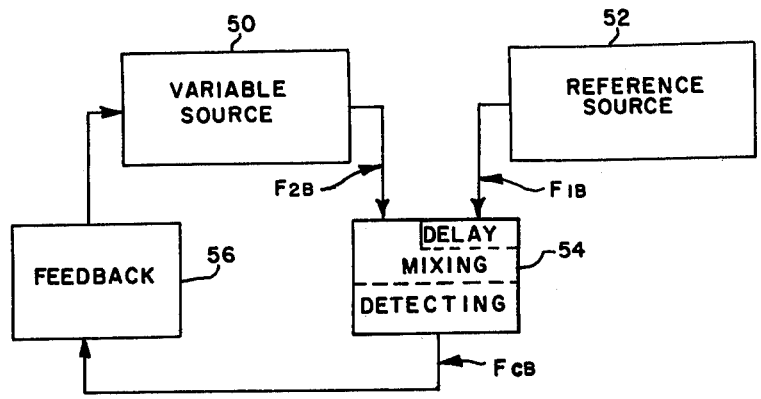
FIG. 3 is a block diagram of a typical system employing the present invention.

Referring now to FIG. 3, there is shown a typical system for controlling the center frequency of a variable source so that it differs from that of a reference source by not more than a prescribed amount. The system could be, for example, used in the time base of a digital network analyzer used in frequency domain test and measurement equipment. Outputs from a variable source and a reference source 50 and 52 respectively are applied to a sideband detector 54. Sideband detector 54 in accordance with the subject invention includes the delay means, mixing means and detector means for mixing the frequency of the variable source with the frequency of the reference source and for detecting a selected sideband portion of the mixing products of the variable source and the reference source. The detected sideband is then applied to feedback means 56 which is associated with the variable source and responsive to the detected sideband for controlling the center frequency of the variable source.

While there has been shown and described the preferred embodiments of the present invention, it will be apparent to those skilled in the art that many changes and modifications may be made thereon or the use thereof. Therefore, the appended claims are intended to cover all changes and modifications that fall within the time spirit and scope of the invention.

The invention is claimed in accordance with the following:

1. A sideband detector, comprising:
    delay means responsive to a first signal for delaying said first signal;
    first mixer means including first digital sequential logic flip-flop means responsive to the delayed signal and to a second signal for providing a first mixed signal;
    second mixer means including second digital sequential logic flip-flop means responsive to both said first and said second signals for providing a second mixed signal; and
    digital detector means defining a sequential logic flip-flop responsive to both said first and said second mixed signals for detecting one sideband of the mixed signals.

2. The method of sideband detecting, comprising:
    applying a first signal to a digital delay means for providing a delayed signal;
    applying said delayed signal and a second signal to a first digital sequential logic flip-flop mixer means for providing a first mixed signal;
    applying both said first and said second signals to a second digital sequential logic flip-flop mixer means for providing a second mixed signal; and
    applying both said first and said second mixed signals to a digital sequential logic flip-flop detector means for detecting one sideband of the mixed signals.

3. A frequency locking system, comprising:
    reference signal generating means for generating a reference signal;
    controlled signal generating means for generating a variable signal, said controlled signal generating means including means for varying said variable signal;
    means including digital sequential logic flip-flop means responsive to both said reference signal and said variable signal for providing a control signal; and
    feedback means disposed between said controlled signal generating means and said means including digital sequential logic flip-flop means for applying said control signal to said means for varying to cause said variable signal to be varied until said variable signal is frequency locked to said reference signal.

* * * * *